(12) United States Patent
Xue et al.

(10) Patent No.: US 9,057,898 B2
(45) Date of Patent: Jun. 16, 2015

(54) ARRAY SUBSTRATE AND LIQUID CRYSTAL PANEL WITH THE SAME

(71) Applicant: Shenzhen China Star Optoelectronics Technology Co., Ltd., Shenzhen, Guangdong (CN)

(72) Inventors: Jingfeng Xue, Shenzhen (CN); Je-hao Hsu, Shenzhen (CN); Xiaohui Yao, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 92 days.

(21) Appl. No.: 13/985,818

(22) PCT Filed: Jun. 27, 2013

(86) PCT No.: PCT/CN2013/078225
§ 371 (c)(1),
(2) Date: Aug. 15, 2013

(87) PCT Pub. No.: WO2014/187011
PCT Pub. Date: Nov. 27, 2014

(65) Prior Publication Data
US 2015/0036067 A1 Feb. 5, 2015

(30) Foreign Application Priority Data
May 24, 2013 (CN) .......................... 2013 1 01985504

(51) Int. Cl.
*G02F 1/133* (2006.01)
*G02F 1/1362* (2006.01)
*G02F 1/1343* (2006.01)
*G02F 1/1368* (2006.01)
*G02B 27/22* (2006.01)
*H01L 27/12* (2006.01)

(52) U.S. Cl.
CPC ........ *G02F 1/13306* (2013.01); *G02F 1/13624* (2013.01); *G02F 1/1343* (2013.01); *G02F 1/1362* (2013.01); *G02F 1/1368* (2013.01); *G02B 27/22* (2013.01); *H01L 27/124* (2013.01)

(58) Field of Classification Search
CPC .......................... G02F 1/13624; G02F 1/13306
See application file for complete search history.

(56) References Cited

U.S. PATENT DOCUMENTS

| | | | |
|---|---|---|---|
| 2010/0007594 A1* | 1/2010 | Lai et al. | 345/98 |
| 2012/0262430 A1* | 10/2012 | Ho et al. | 345/204 |
| 2012/0320099 A1* | 12/2012 | Wu et al. | 345/690 |
| 2013/0128166 A1* | 5/2013 | Chiang et al. | 349/38 |

\* cited by examiner

*Primary Examiner* — Dennis Y Kim
(74) *Attorney, Agent, or Firm* — Andrew C. Cheng (57) ABSTRACT

An array substrate and a liquid crystal display are disclosed. Each of the pixel cells includes a first, a second and a third pixel electrode, and a first, a second, a third, and a fourth switch. One corresponding scanning line are configured to turn on or off the four switches. The corresponding first data line inputs the first data signals to the first pixel electrode via the first switch. The corresponding second data line inputs the second data signals to the second pixel electrode and the third pixel electrode by the second switch and the third switch. The first end of the fourth switch connects to one of the second pixel electrode and the third pixel electrode. The second end of the fourth switch connects to the common electrode. In this way, the array substrate not only increases the aperture rate in the 2D display mode, but also decreases the cross talk effect in the 3D display mode. In addition, the number of the scanning drivers is reduced.

8 Claims, 7 Drawing Sheets

ARRAY SUBSTRATE AND LIQUID CRYSTAL PANEL WITH THE SAME

BACKGROUND OF THE INVENTION

1. Field of the Invention

The present disclosure relates to liquid crystal display (LCD) technology, and more particularly to an array substrate and a liquid crystal panel with the same.

2. Discussion of the Related Art

Vertical Alignment (VA) LCDs are characterized by attributes including quick response time and high contrast, and thus have become a current trend of LCD. However, the alignment and the reflective rate of the liquid crystal are not the same, and thus the transmission rate is low at the case of large squint angle. The color displayed at the squint angle and the center view is different, especially in a wide viewing angle. In order to overcome the problem, one pixel is divided into a main-pixel area and a sub-pixel area. Each of the areas is divided to four domains, and thus each of the pixels includes eight domains. By applying different voltage to the main-pixel area and the sub-pixel area, the alignment of the liquid crystal in the two areas are different such that the low color shirt (LCS) effect is achieved.

In 3D Film-type Patterned Retarder (FPR) technology, pixels arranged in two adjacent rows respectively corresponds to the left eye and the right eye, which generate the signals for left eye image and the right eye image.

In the 3D display mode, as the viewing angle is large, the cross talk may occur, i.e., the right eye image is also observed by the left eye. The divided image is first received by the viewers' eye and are then integrated by viewers' brain to obtain a 3D image. As the cross talk may occur and the viewers may observe an overlap image, a black matrix (BM) is adopted to reduce the cross talk effect. However, such solution may result in a low aperture rate in the 2D display mode, which results in low brightness.

By adopting the LCS design, the aperture rate issue and the cross talk issue may be resolved. That is, the main-pixel area and the sub-pixel area display normal 2D images when in the 2D display mode, and when in the 3D display ode, the main-pixel area displays a black image equivalent to the BM and the sub-pixel area displays normal 3D images so as to reduce the cross talk. However, as only the sub-pixel area displays the 3D image in the 3D display mode, the LCS effect cannot be achieved.

Figure 1:
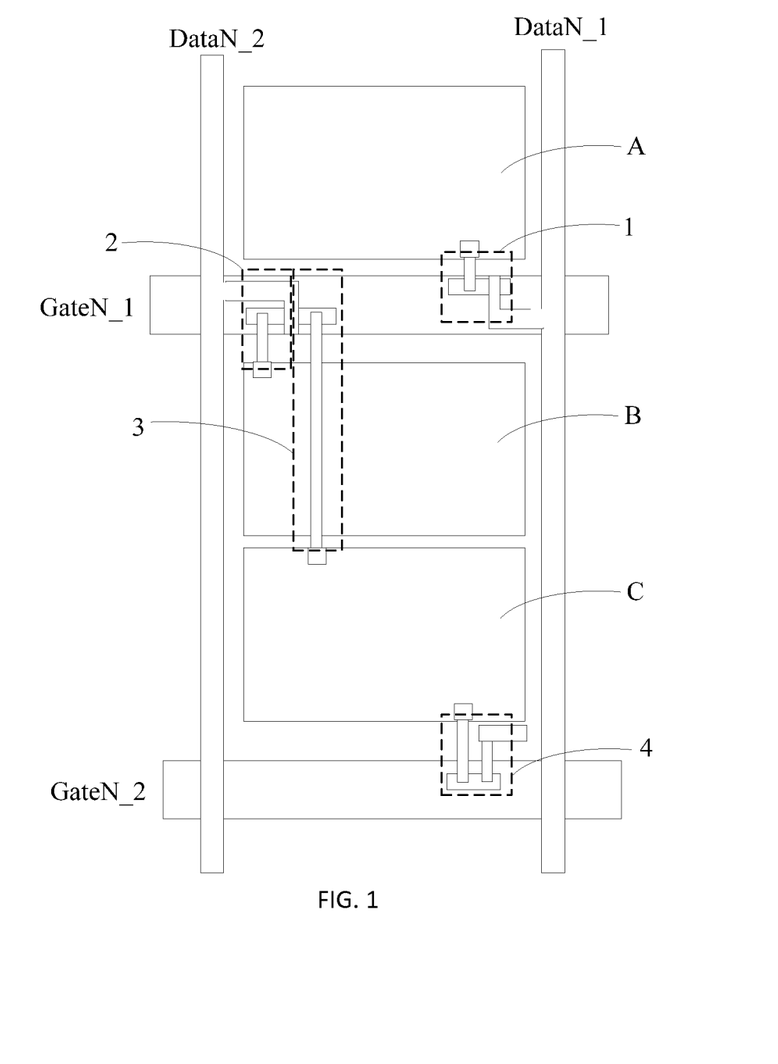
FIG. 1 is a schematic view of a conventional array substrate.
Figure 2:
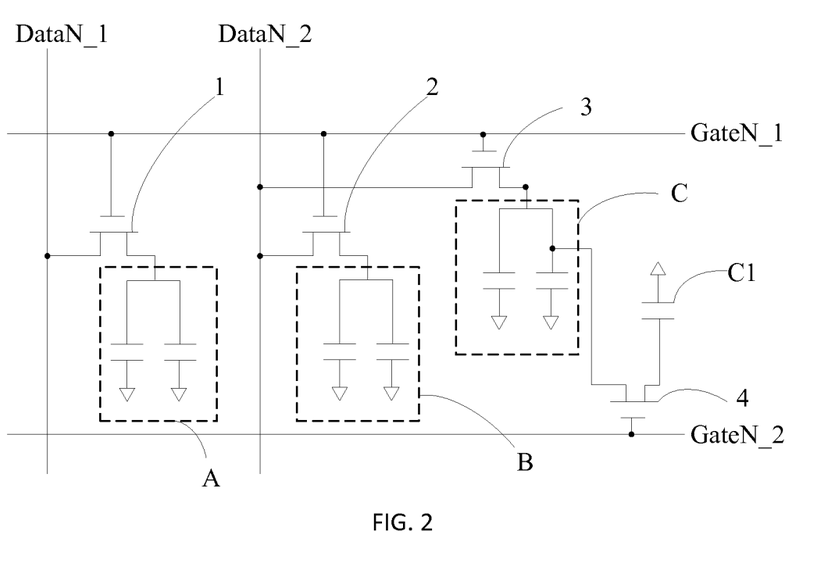
FIG. 2 is an equivalent-circuit diagram of the pixel of FIG. 1.

Referring to FIGS. 1 and 2, one pixel is divided to three sub-pixel area (A, B, C), and each sub-pixel area is divided to four domains. Each pixel is driven by two data lines and two scanning lines. In the 2D display mode, GateN_1 turns on the transistors 1, 2, 3, DataN_1 inputs corresponding data signals to the sub-pixel area (A), and DataN_2 inputs corresponding data signals to the sub-pixel areas (B, C) such that the three sub-pixel areas (A, B, C) can display normal 2D images. As a result, the aperture rate in the 2D display mode is enhanced. The DataN_1 and DataN_2 input different data signals to the sub-pixel areas (A, B, C) and thus the voltage of the sub-pixel areas are different. Afterward, the GateN_2 turns on the transistor 4, and the voltage of the sub-pixel area (B) is different from that of sub-pixel area (C) due to the capacitor (C). As such, the voltage of the sub-pixel areas (A, B, C) are different so as to achieve the LCS effect in the 2D display mode. In the 3D display mode, GateN_1 turns on the transistors 1, 2, 3, and DataN_1 inputs corresponding data signals to the sub-pixel area (A) o as to display the black image. DataN_2 inputs corresponding data signals to sub-pixel areas (B, C) such that the sub-pixel areas (B, C) display 3D images. As such, one sub-pixel area (A) displaying the black image is between the sub-pixel areas (B, C) of one column pixel for displaying the left eye image and the sub-pixel areas (B, C) of another column pixel for displaying right eye image. The GateN_2 turns on the transistor 4, and the voltage of the sub-pixel areas (B, C) are different due to the capacitor C1 so that the LCS effect is achieved in the 3D display mode.

However, each pixel has to be driven by two scanning lines with the above solution, which needs more scanning drivers to be adopted. Thus, the cost is high and may result in a lower aperture rate.

SUMMARY

The object of the invention is to provide an array substrate and a liquid crystal display not only to increase the aperture rate in the 2D display mode, but also decrease the cross talk effect in the 3D display mode. In addition, the number of the scanning drivers is reduced.

In one aspect, an array substrate includes: a plurality of scanning lines, a plurality of first data lines, a plurality of second data lines, common electrodes, and a plurality of pixel cells arranged in a matrix with rows and columns, each pixel cells corresponds to one scanning line, one first data line, and one second data line; each of the pixel cell includes a first pixel electrode, a second pixel electrode and a third pixel electrode arranged along a row direction, and a first switch, a second switch, and a third switch respectively for the first pixel electrode, the second pixel electrode and the third pixel electrode, each of the pixel cell further includes a fourth switch, each of the first switch, the second switch, and the third switch includes a control end, an input end, and an output end, and the fourth switch includes the control end, a first end and a second end; wherein in each pixel cell, the control ends of the first, the second and the third switch connect to one corresponding scanning line, the input end of the first switch connects to the corresponding first data line, the output end of the first switch connects to the first pixel electrode, the input end of the second switch and the input end of the third switch connect to the second data line, the output end of the second switch connects to the second pixel electrode, and the output end of the third switch connects to the third pixel electrode; the control end of the fourth switch connects to the corresponding scanning line, the first end of the fourth switch connects to one of the second pixel electrode and the third pixel electrode, the second end of the fourth switch connects to the common electrode, a current amount of the fourth switch when the fourth switch is turn on is less than the current amount of the third switch when the third switch is turn on such that a voltage difference between the pixel electrode connected to the fourth switch and the common electrode is not zero; wherein in the 2D display mode, the corresponding scanning line inputs scanning signals to turn on the first switch, the second switch, the third switch and the fourth switch, the corresponding first data line inputs the first data signals to the first pixel electrode via the first switch, the corresponding second data line inputs the second data signals to the second pixel electrode and the third pixel electrode by the second switch and the third switch such that the first pixel electrode, the second pixel electrode and the third pixel electrode display corresponding 2D images, and the voltage difference between the second pixel electrode and the third pixel electrode is not zero as the fourth switch is turn on; in the 3D display mode, the corresponding scanning line inputs the scanning signals to turn on the first switch, the second switch, the third switch, and the fourth switch, the first data line inputs the third data signals to the first pixel electrode by the first switch such that the first pixel electrode displays the black image, the second data line inputs the fourth data signals to the second pixel electrode and the third pixel electrode respectively by the second switch and the third switch such that the second pixel electrode and the third pixel electrode display corresponding 3D images, and the voltage difference between the second pixel electrode and the third pixel electrode is not zero as the fourth switch is turn on; and the scanning lines, the first switch, the second switch, the third switch, and the fourth switch are arranged between the first pixel electrode and the second pixel electrode.

Wherein the first switch, the second switch, the third switch and the fourth switch are respectively a first transistor, a second transistor, a third transistor, and a fourth transistor; the control ends of the first switch, the second switch, and the third switch correspond to a gate of the transistor, and the input end of the first switch, the second switch and the third switch correspond to a source of the transistor, the output end of the first switch, the second switch and the third switch correspond to a drain of the transistor, the control end of the fourth switch corresponds to the gate of the transistor, the first end of the fourth switch corresponds to the source of the transistor, and the second end of the fourth switch corresponds to the drain of the transistor; and a width/length ratio of the fourth transistor is smaller than that of other three transistors such that when the fourth transistor is turn on, the voltage difference between the second pixel electrode and the common electrode is not zero.

In another aspect, an array substrate includes: a plurality of scanning lines, a plurality of first data lines, a plurality of second data lines, common electrodes, and a plurality of pixel cells arranged in a matrix with rows and columns, each pixel cells corresponds to one scanning line, one first data line, and one second data line; each of the pixel cell includes a first pixel electrode, a second pixel electrode and a third pixel electrode arranged along a row direction, and a first switch, a second switch, and a third switch respectively for the first pixel electrode, the second pixel electrode and the third pixel electrode, each of the pixel cell further includes a fourth switch, each of the first switch, the second switch, and the third switch includes a control end, an input end, and an output end, and the fourth switch includes the control end, a first end and a second end; wherein in each pixel cell, the control ends of the first, the second and the third switch connect to one corresponding scanning line, the input end of the first switch connects to the corresponding first data line, the output end of the first switch connects to the first pixel electrode, the input end of the second switch and the input end of the third switch connect to the second data line, the output end of the second switch connects to the second pixel electrode, and the output end of the third switch connects to the third pixel electrode; the control end of the fourth switch connects to the corresponding scanning line, the first end of the fourth switch connects to one of the second pixel electrode and the third pixel electrode, the second end of the fourth switch connects to the common electrode, and a voltage difference between the pixel electrode connected to the fourth switch and the common electrode is not zero when the fourth switch is turn on; wherein in the 2D display mode, the corresponding scanning line inputs scanning signals to turn on the first switch, the second switch, the third switch and the fourth switch, the corresponding first data line inputs the first data signals to the first pixel electrode via the first switch, the corresponding second data line inputs the second data signals to the second pixel electrode and the third pixel electrode by the second switch and the third switch such that the first pixel electrode, the second pixel electrode and the third pixel electrode display corresponding 2D images, and the voltage difference between the second pixel electrode and the third pixel electrode is not zero as the fourth switch is turn on; and in the 3D display mode, the corresponding scanning line inputs the scanning signals to turn on the first switch, the second switch, the third switch, and the fourth switch, the first data line inputs the third data signals to the first pixel electrode by the first switch such that the first pixel electrode displays the black image, the second data line inputs the fourth data signals to the second pixel electrode and the third pixel electrode respectively by the second switch and the third switch such that the second pixel electrode and the third pixel electrode display corresponding 3D images, and the voltage difference between the second pixel electrode and the third pixel electrode is not zero as the fourth switch is turn on.

Wherein a current amount of the fourth switch when the fourth switch is turn on is less than the current amount of the third switch when the third switch is turn on such that the voltage difference between the pixel electrode connected to the fourth switch and the common electrode is not zero Wherein the first switch, the second switch, the third switch and the fourth switch are respectively a first transistor, a second transistor, a third transistor, and a fourth transistor; the control ends of the first switch, the second switch, and the third switch correspond to a gate of the transistor, the input end of the first switch, the second switch, and the third switch correspond to a source of the transistor, the output end of the first switch, the second switch, and the third switch correspond to a drain of the transistor, the control end of the fourth switch corresponds to the gate of the transistor, the first end of the fourth switch corresponds to the source of the transistor, the second end of the fourth switch corresponds to the drain of the transistor; and a width/length ratio of the fourth transistor is smaller than that of other three transistors such that when the fourth transistor is turn on, the voltage difference between the second pixel electrode and the common electrode is not zero.

Wherein the scanning lines, the first switch, the second switch, the third switch, and the fourth switch are arranged between the first pixel electrode and the second pixel electrode.

In another aspect, a liquid crystal display includes: a display panel, a scanning driver and a data driver for driving the display panel, the display panel includes the array substrate, the color filtering substrate and a liquid crystal layer between the array substrate and the color filtering substrate. The array substrate includes: a plurality of scanning lines, a plurality of first data lines, a plurality of second data lines, common electrodes, and a plurality of pixel cells arranged in a matrix with rows and columns, each pixel cells corresponds to one scanning line, one first data line, and one second data line; each of the pixel cell includes a first pixel electrode, a second pixel electrode and a third pixel electrode arranged along a row direction, and a first switch, a second switch, and a third switch respectively for the first pixel electrode, the second pixel electrode and the third pixel electrode, each of the pixel cell further includes a fourth switch, each of the first switch, the second switch, and the third switch includes a control end, an input end, and an output end, and the fourth switch includes the control end, a first end and a second end; wherein in each pixel cell, the control ends of the first, the second and the third switch connect to a corresponding scanning line, the input end of the first switch connects to the corresponding first data line, the output end of the first switch connects to the first pixel electrode, the input end of the second switch and the input end of the third switch connect to the second data line, the output end of the second switch connects to the second pixel electrode, and the output end of the third switch connects to the third pixel electrode; the control end of the fourth switch connects to the corresponding scanning line, the first end of the fourth switch connects to one of the second pixel electrode and the third pixel electrode, the second end of the fourth switch connects to the common electrode, and a voltage difference between the pixel electrode connected to the fourth switch and the common electrode is not zero when the fourth switch is turn on; wherein in the 2D display mode, the corresponding scanning line inputs scanning signals to turn on the first switch, the second switch, the third switch and the fourth switch, the corresponding first data line inputs the first data signals to the first pixel electrode via the first switch, the corresponding second data line inputs the second data signals to the second pixel electrode and the third pixel electrode by the second switch and the third switch such that the first pixel electrode, the second pixel electrode and the third pixel electrode display corresponding 2D images, and the voltage difference between the second pixel electrode and the third pixel electrode is not zero as the fourth switch is turn on; and in the 3D display mode, the corresponding scanning line inputs the scanning signals to turn on the first switch, the second switch, the third switch, and the fourth switch, the first data line inputs the third data signals to the first pixel electrode by the first switch such that the first pixel electrode displays the black image, the second data line inputs the fourth data signals to the second pixel electrode and the third pixel electrode respectively by the second switch and the third switch such that the second pixel electrode and the third pixel electrode display corresponding 3D images, and the voltage difference between the second pixel electrode and the third pixel electrode is not zero as the fourth switch is turn on.

Wherein a current amount of the fourth switch when the fourth switch is turn on is less than the current amount of the third switch when the third switch is turn on such that the voltage difference between the pixel electrode connected to the fourth switch and the common electrode is not zero.

Wherein the first switch, the second switch, the third switch and the fourth switch are respectively a first transistor, a second transistor, a third transistor, and a fourth transistor; the control ends of the first switch, the second switch, and the third switch correspond to a gate of the transistor, the input end of the first switch, the second switch, and the third switch correspond to a source of the transistor, the output end of the first switch, the second switch, and the third switch correspond to a drain of the transistor, the control end of the fourth switch corresponds to the gate of the transistor, the first end of the fourth switch corresponds to the source of the transistor, the second end of the fourth switch corresponds to the drain of the transistor; and a width/length ratio of the fourth transistor is smaller than that of other three transistors such that when the fourth transistor is turn on, and the voltage difference between the second pixel electrode and the common electrode is not zero.

Wherein the scanning lines, the first switch, the second switch, the third switch, and the fourth switch are arranged between the first pixel electrode and the second pixel electrode.

DETAILED DESCRIPTION OF THE EMBODIMENTS

Figure 3:
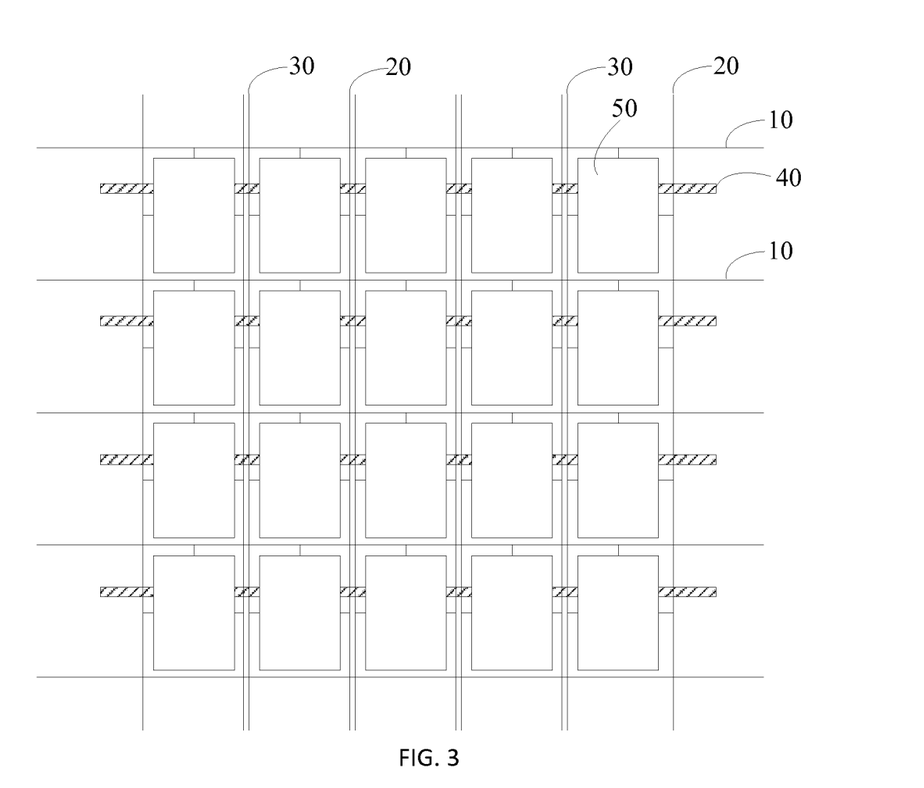
FIG. 3 is a schematic view of one array substrate in accordance with one embodiment.

Embodiments of the invention will now be described more fully hereinafter with reference to the accompanying drawings, in which embodiments of the invention are shown. Referring to FIG. 3, the array substrate includes a plurality of scanning lines 10, a plurality of first data lines 20, a plurality of second data lines 20, common electrodes 40, and a plurality of pixel cells 50 arranged in a matrix with rows and columns. Each pixel cells 50 corresponds to one scanning line 10, one first data line 20, and one data line 30.

Figure 4:
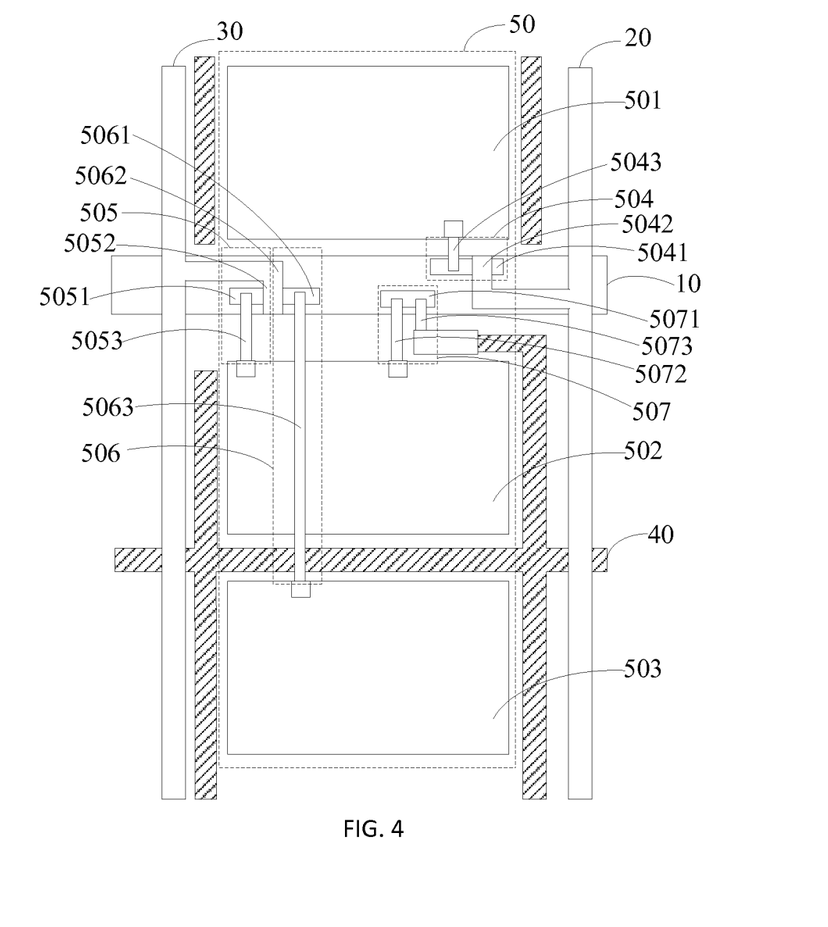
FIG. 4 is a schematic view of the pixel cell of the array substrate in accordance with one embodiment.
Figure 5:
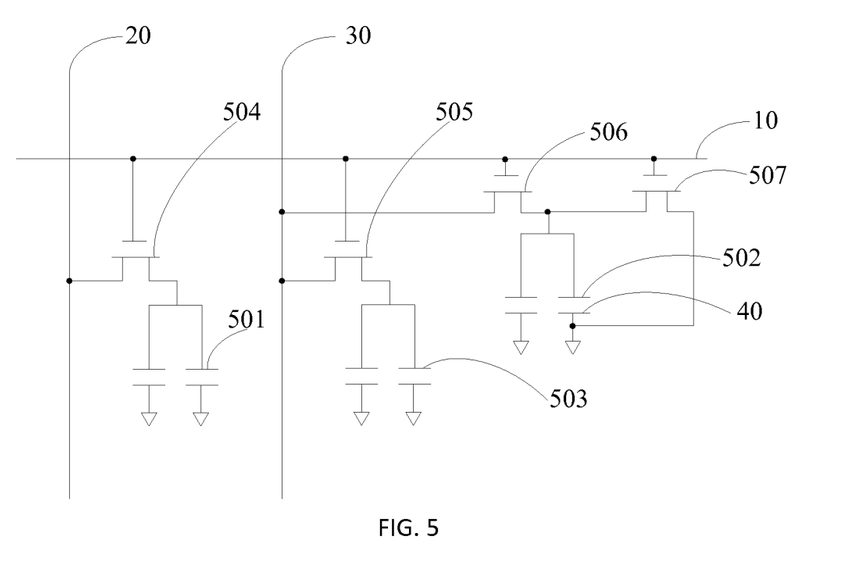
FIG. 5 is an equivalent-circuit diagram of the pixel cell of FIG. 4.

Referring to FIGS. 4 and 5, one pixel cell is taken as example to illustrate. The pixel cell 50 includes a first pixel electrode 501, a second pixel electrode 502 and a third pixel electrode 503 arranged along a row direction. In addition, the pixel cell 50 also includes a first switch 504, a second switch 505, and a third switch 506. In addition, the pixel cell 50 further includes a fourth switch 507. The scanning lines 10, the first switch 504, the second switch 505, the third switch 506, and the fourth switch 507 are arranged between the first pixel electrode 501 and the second pixel electrode 502. Each of the first switch 504, the second switch 505, and the third switch 506 includes a control end, an input end, and an output end. The fourth switch 507 includes a control end, a first end and a second end.

The control end 5041 of the first switch 504, the control end 5051 of the second switch 505, the control end 5061 of the third switch 506, the control end 5071 of the fourth switch 507 connects to a corresponding scanning line 10 of the pixel cell 50. The input end 5042 of the first switch 504 connects to the corresponding first data lines 20 of the pixel cell 50. The output end 5043 of the first switch 504 connects to the first pixel electrode 501. The input end 5052 of the second switch 505 and the input end 5062 of the third switch 506 connect to the second data line 30. The output end 5053 of the second switch 505 connects to the second pixel electrode 502. The output end 5063 of the third switch 506 connects to the third pixel electrode 503. The first end 5072 of the fourth switch 507 connects to the second pixel electrode 502. The second end 5073 of the fourth switch 507 connects to the common electrodes 40. The scanning lines 10 inputs the scanning signals to control the four switches 504, 505, 506, 507. The first data line 20 inputs the first data signals to the first pixel electrode 501 via the first switch 504. The second data lines 20 inputs the data signals to the second pixel electrode 502 and the third pixel electrode 503 respectively by the second switch 505 and the third switch 506.

The mechanism of the liquid crystal display relates to that a certain voltage difference is between the pixel electrodes of the array substrate and the common electrode of the color filtering substrate such that the display panel can display corresponding images. Generally, the voltage of the common electrode of the color filtering substrate is fixed, and the voltage of the pixel electrode changes in accordance with the gray scale. In the embodiment, the voltage signals of the common electrode of the color filtering substrate and that of the common electrode 40 of the array substrate is the same. Thus, the voltage difference respectively between the pixel electrodes 501, 502, 503 and the common electrodes 40 changes all the time.

In the 2D display mode, the fixed common voltage is input to the common electrode 40. In one embodiment, the common voltage is about 7V, and the voltage applied to the pixel electrodes 501, 502, 503 is in the range of 0 to 14 V. In the first scanning frame, the scanning line 10 inputs the scanning signals to turn on the first switch 504, the second switch 505, the third switch 506, and the fourth switch 507. The first data line 20 inputs the first data signals to the first pixel electrode 501 by the first switch 504. The second data line 20 inputs the second data signals to the second pixel electrode 502 and the third pixel electrode 503 respectively by the second switch 505 and the third switch 506 such that the voltage of the common electrode 40 is different from that of the first pixel electrode 501, the second pixel electrode 502, and the third pixel electrode 503. Thus, the first pixel electrode 501, the second pixel electrode 502, the third pixel electrode 503 are capable of displaying the corresponding 2D images and the aperture rate in the 2D display mode in increased.

In the embodiment, the first data signals from the first data lines 20 are different from the second data signals from the second data lines 30 such that the voltage of the first pixel electrode 501 is different from that of the second pixel electrode 502 and third pixel electrode 503. Without being affected by the first switch 504, the second data line 30 inputs the second data signals to the second pixel electrode 502 and the third pixel electrode 503, and thus the voltage of the second pixel electrode 502 and the third pixel electrode 503 are the same. In the embodiment, if the fourth switch 507 is turn on, the voltage of the second pixel electrode 502 and third pixel electrode 503 are different. Specifically, when the fourth switch 507 is turn on, the second pixel electrode 502 and the common electrodes 40 are electrically connected, and the voltage of the second pixel electrode 502 increases gradually until being the same with the voltage of the common electrode 40. When the voltage of the second pixel electrode 502 is higher than that of the common electrode 40, some electric charges transfer to the common electrode 40 such that the voltage of the second pixel electrode 502 decreases gradually until the voltage of the second pixel electrode 502 is lower than that of the third pixel electrode 503. In this way, the voltage difference between the second pixel electrode 502 and the third pixel electrode 503 is not zero. When the voltage of the second pixel electrode 502 is lower than the voltage of the common electrode 40, some electrical charges are transferred to the second pixel electrode 502 such that the voltage of the second pixel electrode 502 increases gradually. Thus, the voltage of the second pixel electrode 502 is higher than that of the third pixel electrode 503. Similarly, the voltage difference between the second pixel electrode 502 and the third pixel electrode 503 is not zero. In the above process, the voltage of the common electrode 40 is fixed. In addition, by controlling the fourth switch 507, the voltage difference between the second pixel electrode 502 and that of the common electrode 40 is not zero. Furthermore, as the current amount of the fourth switch 507 is less than that of the third switch 506, when the fourth switch 507 and the third switch 506 are turn on simultaneously, the transfer speed of the electrical charges from the second data line 30 to the second pixel electrode 502 is faster than that from the second pixel electrode 502 to the common electrodes 40. As such, when the fourth switch 507 is turn on, the voltage difference between the second pixel electrode 502 and the third pixel electrode 503 is not zero.

For example, the common electrode 40 inputs a fixed common voltage, which is about 7V. The second data line 30 inputs the second data signals, which is 9V, to the second pixel electrode 502 and the third pixel electrode 503. The voltage of the second pixel electrode 502 is higher than that of the common electrodes 40. When the fourth switch 507 is turn on, some of the electrical charges of the second pixel electrode 502 are transferred to the common electrode 40. As the transfer speed of the fourth switch 507 is slower, when the fourth switch 507 is turn on, the voltage of the second pixel electrode 502 changes from 9V to 8V while the voltage of the common electrode 40 remains 7V. When some of the electrical charges are released by the common electrodes 40, the voltage difference between the second pixel electrode 502 and the common electrodes 40 remains not equaling to zero so that the second pixel electrode 502 can display 2D image. When the voltage of the second pixel electrode 502 decreases gradually and the voltage of the third pixel electrode 503 remains 9V, the voltage of the second pixel electrode 502 is lower than that of the third pixel electrode 503. As such, the voltage difference between the second pixel electrode 502 and the third pixel electrode 503 is not zero.

With the above configuration, the voltage of any two of the first pixel electrode 501, the second pixel electrode 502, and the third pixel electrode 503 are different. Thus, the alignment of the liquid crystal respectively corresponding to the first pixel electrode 501, the second pixel electrode 502, and the third pixel electrode 503 are different such that the color shift in the wide viewing angle is reduced.

In other embodiments, the first data signals from the first data line is the same with the second data signals from the second data line such that the voltage of the first pixel electrode is the same with that of the third pixel electrode. The fourth switch is turn on to maintain the voltage difference between the second pixel electrode and the third pixel electrode be not zero. This can also decrease the color shift to some extent.

Figure 6:
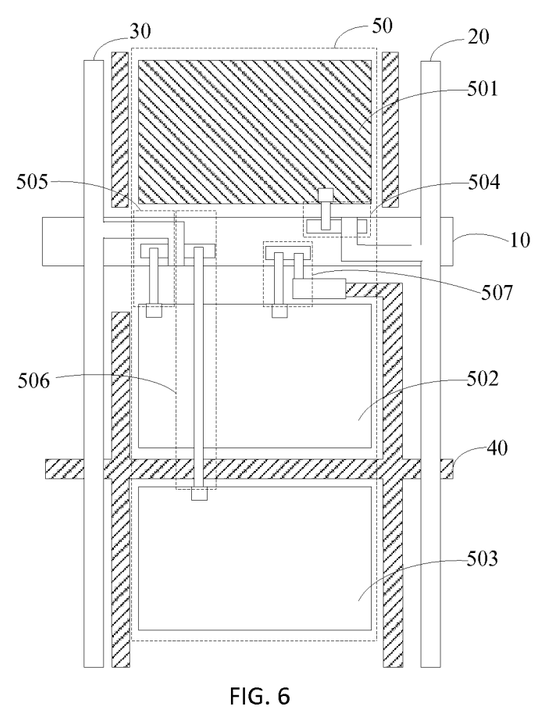
FIG. 6 is a schematic view showing the display effect of the pixel cell of FIG. 4 in 3D display mode.

Referring to FIG. 6, in the 3D display mode, the fixed common voltage is input to the common electrodes 40. The scanning line 10 inputs the scanning signals to turn on the first switch 504, the second switch 505, the third switch 506, and the fourth switch 507. The first data line 20 inputs the third data signals to the first pixel electrode 501 via the first switch 504 such that the first pixel electrode 501 displays the black image. The second data line 30 inputs the fourth data signals to the second pixel electrode 502 and the third pixel electrode 503 respectively by the second switch 505 and the third switch 506 such that the second pixel electrode 502 and the third pixel electrode 503 display corresponding 3D images. As the first pixel electrode 501, the second pixel electrode 502, and the third pixel electrode 503 are arranged along the row direction, the black image displayed by the first pixel electrode 501 acts like the BM between the second pixel electrode 502 of the current pixel cell and the third pixel electrode 503 of the previous pixel cell. In the 3D display mode, the black image displayed by the first pixel electrode 501 blocks the cross talk between the left eye image and the right eye image.

In addition, when the fourth switch 507 is turn on, the second pixel electrode 502 and the common electrodes 40 are electrically connected such that the voltage of the second pixel electrode 502 changes and thus the voltage difference between the second pixel electrode 502 and the third pixel electrode 503 is not zero. In this way, the alignment of the liquid crystal corresponding to the second pixel electrode 502 is different from that of the liquid crystal corresponding to the third pixel electrode 503. Thus, the color shift in the 3D display mode is reduced. In addition, during the turn-on period of the fourth switch 507, the voltage difference between the second pixel electrode 502 and the common electrode 40 is not zero such that the second pixel electrode 502 displays corresponding 3D images.

Therefore, the array substrate can increase the aperture rate in the 2D display mode and reduce the cross talk in the 3D display mode. Also, the color shift effect can be reduced both in the 2D and 3D display modes. Furthermore, the pixel cell 50 is driven by only one scanning line 10, one first data line 20, and one second data line 30. Not only the aperture rate is enhanced but also the manufacturing cost is reduced.

In one embodiment, the first switch 504, the second switch 505, the third switch 506 and the fourth switch 507 are respectively a first transistor, a second transistor, a third transistor, and a fourth transistor. The control ends of the first switch 504, the second switch 505, and the third switch 506 correspond to a gate of the transistor. The input end of the first switch 504, the second switch 505, and the third switch 506 correspond to a source of the transistor. The output end of the first switch 504, the second switch 505, and the third switch 506 correspond to a drain of the transistor. The control end of the fourth switch 507 corresponds to the gate of the transistor. The first end of the fourth switch 507 corresponds to the source of the transistor. The second end of the fourth switch 507 corresponds to the drain of the transistor. In addition, the width/length ratio of the fourth transistor is smaller than that of other three transistors. Thus, during the turn-on time of the fourth transistor, the transfer speed of the electrical charges from the second pixel electrode to the common electrode is slower than the charging speed of the first data lines 20 and the second data line 30, which respectively charges the first pixel electrode 501, the second pixel electrode 502, and the third pixel electrode 503. As such, the voltage difference between the second pixel electrode 502 and the common electrodes 40 is not zero.

In other embodiments, the switches may be triodes or other three-end control switches. The first end of the fourth switch connects to the third pixel electrode. During the turn-on period of the fourth switch, the voltage difference between the third pixel electrode and the second pixel electrode is not zero. In addition, the voltage difference between the third pixel electrode and the common electrode is also not zero.

Figure 7:
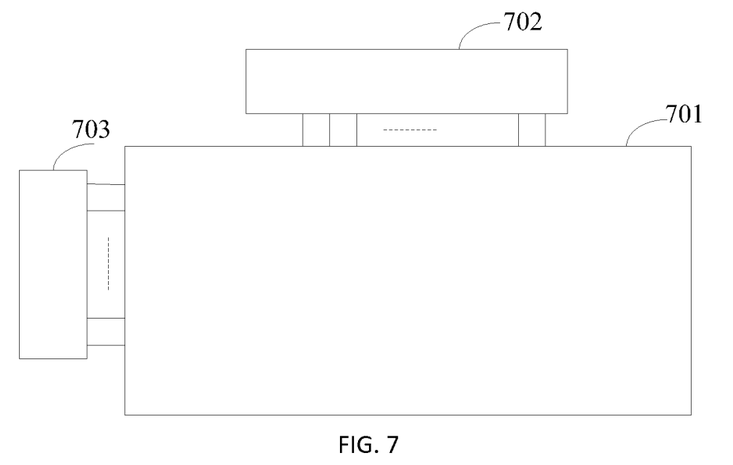
FIG. 7 is a schematic view of the liquid crystal display in accordance with one embodiment.
Figure 8:
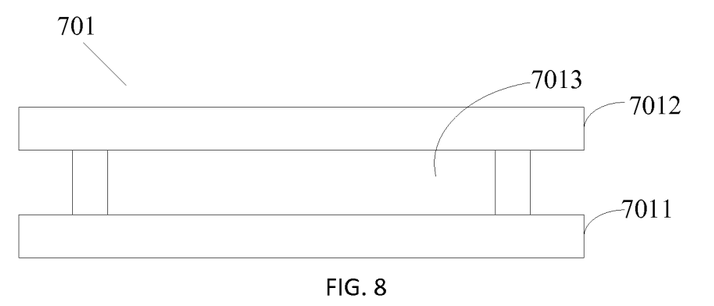
FIG. 8 is a schematic view of the display panel of the liquid crystal display of FIG. 7.

Referring to FIGS. 7 and 8, the liquid crystal display includes a display panel 701, a scanning driver 702 and a data driver 703 for driving the display panel 701. The display panel 701 includes the array substrate 7011, the color filtering substrate 7012 and a liquid crystal layer 7013 between the array substrate 7011 and the color filtering substrate 7012. The array substrate 7011 may be the above array substrate. The scanning driver 702 inputs the scanning signals to the scanning lines of the array substrate 7011. Afterward, the data driver 703 inputs the data signals to the data lines of the array substrate 7011 such that the display panel 701 can display corresponding images.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. An array substrate, comprising:
a plurality of scanning lines, a plurality of first data lines, a plurality of second data lines, common electrodes, and a plurality of pixel cells arranged in a matrix with rows and columns, each pixel cell corresponds to one scanning line, one first data line, and one second data line;
each of the pixel cells comprises a first pixel electrode, a second pixel electrode and a third pixel electrode arranged along a row direction, and a first switch, a second switch, and a third switch respectively for the first pixel electrode, the second pixel electrode and the third pixel electrode, each of the pixel cells further comprises a fourth switch, each of the first switch, the second switch, and the third switch comprises a control end, an input end, and an output end, and the fourth switch comprises the control end, a first end and a second end;
wherein in each pixel cell, the control ends of the first, the second and the third switch connect to one corresponding scanning line, the input end of the first switch connects to the corresponding first data line, the output end of the first switch connects to the first pixel electrode, the input end of the second switch and the input end of the third switch connect to the second data line, the output end of the second switch connects to the second pixel electrode, and the output end of the third switch connects to the third pixel electrode;
the control end of the fourth switch connects to the corresponding scanning line, the first end of the fourth switch connects to one of the second pixel electrode and the third pixel electrode, the second end of the fourth switch connects to the common electrodes, a current amount of the fourth switch when the fourth switch is turned on is less than the current amount of the third switch when the third switch is turned on such that a voltage difference between the pixel electrode connected to the fourth switch and the common electrodes is not zero;
wherein in a 2D display mode, the corresponding scanning line inputs scanning signals to turn on the first switch, the second switch, the third switch and the fourth switch, the corresponding first data line inputs first data signals to the first pixel electrode via the first switch, the corresponding second data line inputs second data signals to the second pixel electrode and the third pixel electrode by the second switch and the third switch such that the first pixel electrode, the second pixel electrode and the third pixel electrode display corresponding 2D images, and the voltage difference between the second pixel electrode and the third pixel electrode is not zero as the fourth switch is turn on;
in a 3D display mode, the corresponding scanning line inputs the scanning signals to turn on the first switch, the second switch, the third switch, and the fourth switch, the first data line inputs third data signals to the first pixel electrode by the first switch such that the first pixel electrode displays a black image, the second data line inputs fourth data signals to the second pixel electrode and the third pixel electrode respectively by the second switch and the third switch such that the second pixel electrode and the third pixel electrode display corresponding 3D images, and the voltage difference between the second pixel electrode and the third pixel electrode is not zero as the fourth switch is turn on; and
the scanning lines, the first switch, the second switch, the third switch, and the fourth switch are arranged between the first pixel electrode and the second pixel electrode.

2. The array substrate as claimed in claim 1, wherein the first switch, the second switch, the third switch and the fourth switch are respectively a first transistor, a second transistor, a third transistor, and a fourth transistor;

the control ends of the first switch, the second switch, and the third switch correspond to gates of the first, second, and third transistors, and the input ends of the first switch, the second switch and the third switch correspond to sources of the first, second, and third transistors, the output ends of the first switch, the second switch and the third switch correspond to drains of the first, second, and third transistors, the control end of the fourth switch corresponds to a gate of the fourth transistor, the first end of the fourth switch corresponds to a source of the fourth transistor, and the second end of the fourth switch corresponds to a drain of the fourth transistor; and a width/length ratio of the fourth transistor is smaller than that of the other three transistors such that when the fourth transistor is turned on, the voltage difference between the second pixel electrode and the common electrode is not zero.

3. An array substrate, comprising:

a plurality of scanning lines, a plurality of first data lines, a plurality of second data lines, common electrodes, and a plurality of pixel cells arranged in a matrix with rows and columns, each pixel cell corresponds to one scanning line, one first data line, and one second data line;

each of the pixel cells comprises a first pixel electrode, a second pixel electrode and a third pixel electrode arranged along a row direction, and a first switch, a second switch, and a third switch respectively for the first pixel electrode, the second pixel electrode and the third pixel electrode, each of the pixel cells further comprises a fourth switch, each of the first switch, the second switch, and the third switch comprises a control end, an input end, and an output end, and the fourth switch comprises the control end, a first end and a second end;

wherein in each pixel cell, the control ends of the first, the second and the third switch connect to one corresponding scanning line, the input end of the first switch connects to the corresponding first data line, the output end of the first switch connects to the first pixel electrode, the input end of the second switch and the input end of the third switch connect to the second data line, the output end of the second switch connects to the second pixel electrode, and the output end of the third switch connects to the third pixel electrode;

the control end of the fourth switch connects to the corresponding scanning line, the first end of the fourth switch connects to one of the second pixel electrode and the third pixel electrode, the second end of the fourth switch connects to the common electrodes, and a voltage difference between the pixel electrode connected to the fourth switch and the common electrodes is not zero when the fourth switch is turned on;

wherein in a 2D display mode, the corresponding scanning line inputs scanning signals to turn on the first switch, the second switch, the third switch and the fourth switch, the corresponding first data line inputs first data signals to the first pixel electrode via the first switch, the corresponding second data line inputs second data signals to the second pixel electrode and the third pixel electrode by the second switch and the third switch such that the first pixel electrode, the second pixel electrode and the third pixel electrode display corresponding 2D images, and the voltage difference between the second pixel electrode and the third pixel electrode is not zero as the fourth switch is turned on;

in a 3D display mode, the corresponding scanning line inputs the scanning signals to turn on the first switch, the second switch, the third switch, and the fourth switch, the first data line inputs third data signals to the first pixel electrode by the first switch such that the first pixel electrode displays a black image, the second data line inputs fourth data signals to the second pixel electrode and the third pixel electrode respectively by the second switch and the third switch such that the second pixel electrode and the third pixel electrode display corresponding 3D images, and the voltage difference between the second pixel electrode and the third pixel electrode is not zero as the fourth switch is turned on; and wherein the scanning lines, the first switch, the second switch, the third switch, and the fourth switch are arranged between the first pixel electrode and the second pixel electrode.

4. The array substrate as claimed in claim 3, wherein a current amount of the fourth switch when the fourth switch is turned on is less than the current amount of the third switch when the third switch is turned on such that the voltage difference between the pixel electrode connected to the fourth switch and the common electrodes is not zero.

5. The array substrate as claimed in claim 4, wherein the first switch, the second switch, the third switch and the fourth switch are respectively a first transistor, a second transistor, a third transistor, and a fourth transistor;

the control ends of the first switch, the second switch, and the third switch correspond to gates of the first, second, and third transistors, the input ends of the first switch, the second switch, and the third switch correspond to sources of the first, second, and third transistors, the output ends of the first switch, the second switch, and the third switch correspond to drains of the first, second, and third transistors, the control end of the fourth switch corresponds to a gate of the fourth transistor, the first end of the fourth switch corresponds to a source of the fourth transistor, the second end of the fourth switch corresponds to a drain of the fourth transistor; and a width/length ratio of the fourth transistor is smaller than that of the other three transistors such that when the fourth transistor is turned on, the voltage difference between the second pixel electrode and the common electrode is not zero.

6. A liquid crystal display, comprising:

a display panel, a scanning driver and a data driver for driving the display panel, the display panel comprises an array substrate, a color filtering substrate and a liquid crystal layer between the array substrate and the color filtering substrate, the array substrate comprises: a plurality of scanning lines, a plurality of first data lines, a plurality of second data lines, common electrodes, and a plurality of pixel cells arranged in a matrix with rows and columns, each pixel cell corresponds to one scanning line, one first data line, and one second data line;

each of the pixel cells comprises a first pixel electrode, a second pixel electrode and a third pixel electrode arranged along a row direction, and a first switch, a second switch, and a third switch respectively for the first pixel electrode, the second pixel electrode and the third pixel electrode, each of the pixel cells further comprises a fourth switch, each of the first switch, the second switch, and the third switch comprises a control end, an input end, and an output end, and the fourth switch comprises the control end, a first end and a second end;

wherein in each pixel cell, the control ends of the first, the second and the third switch connect to a corresponding scanning line, the input end of the first switch connects to the corresponding first data line, the output end of the first switch connects to the first pixel electrode, the input end of the second switch and the input end of the third switch connect to the second data line, the output end of the second switch connects to the second pixel electrode, and the output end of the third switch connects to the third pixel electrode;

the control end of the fourth switch connects to the corresponding scanning line, the first end of the fourth switch connects to one of the second pixel electrode and the third pixel electrode, the second end of the fourth switch connects to the common electrodes, and a voltage difference between the pixel electrode connected to the fourth switch and the common electrodes is not zero when the fourth switch is turned on;

wherein in a 2D display mode, the corresponding scanning line inputs scanning signals to turn on the first switch, the second switch, the third switch and the fourth switch, the corresponding first data line inputs first data signals to the first pixel electrode via the first switch, the corresponding second data line inputs second data signals to the second pixel electrode and the third pixel electrode by the second switch and the third switch such that the first pixel electrode, the second pixel electrode and the third pixel electrode display corresponding 2D images, and the voltage difference between the second pixel electrode and the third pixel electrode is not zero as the fourth switch is turned on;

in a 3D display mode, the corresponding scanning line inputs the scanning signals to turn on the first switch, the second switch, the third switch, and the fourth switch, the first data line inputs third data signals to the first pixel electrode by the first switch such that the first pixel electrode displays a black image, the second data line inputs fourth data signals to the second pixel electrode and the third pixel electrode respectively by the second switch and the third switch such that the second pixel electrode and the third pixel electrode display corresponding 3D images, and the voltage difference between the second pixel electrode and the third pixel electrode is not zero as the fourth switch is turned on; and wherein the scanning lines, the first switch, the second switch, the third switch, and the fourth switch are arranged between the first pixel electrode and the second pixel electrode.

7. The device as claimed in claim 6, wherein a current amount of the fourth switch when the fourth switch is turned on is less than the current amount of the third switch when the third switch is turned on such that the voltage difference between the pixel electrode connected to the fourth switch and the common electrodes is not zero.

8. The device as claimed in claim 7, wherein the first switch, the second switch, the third switch and the fourth switch are respectively a first transistor, a second transistor, a third transistor, and a fourth transistor;

the control ends of the first switch, the second switch, and the third switch correspond to gates of the first, second, and third transistors, the input ends of the first switch, the second switch, and the third switch correspond to sources of the first, second, and third transistors, the output ends of the first switch, the second switch, and the third switch correspond to drains of the first, second, and third transistors, the control end of the fourth switch corresponds to a gate of the fourth transistor, the first end of the fourth switch corresponds to a source of the fourth transistor, the second end of the fourth switch corresponds to a drain of the fourth transistor; and a width/length ratio of the fourth transistor is smaller than that of the other three transistors such that when the fourth transistor is turned on, and the voltage difference between the second pixel electrode and the common electrodes is not zero.

* * * * *